United States Patent
Kuhara et al.

(10) Patent No.: US 6,483,161 B1
(45) Date of Patent: Nov. 19, 2002

(54) SUBMOUNT WITH FILTER LAYERS FOR MOUNTING A BOTTOM-INCIDENCE TYPE PHOTODIODE

(75) Inventors: Yoshiki Kuhara, Osaka (JP); Yasuhiro Iguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/928,397

(22) Filed: Aug. 14, 2001

(51) Int. Cl.⁷ .......................................... H01L 31/0203
(52) U.S. Cl. ...................... 257/433; 257/100; 257/431; 257/436
(58) Field of Search ........................ 257/100, 431–436, 257/461

(56) References Cited

U.S. PATENT DOCUMENTS

| | | | |
|---|---|---|---|
| 5,574,289 A | * 11/1996 | Aoki et al. | 257/17 |
| 5,747,861 A | * 5/1998 | Dentai | 257/435 |
| 5,764,826 A | * 6/1998 | Kuhara et al. | 385/24 |
| 5,825,047 A | * 10/1998 | Ajisawa et al. | 257/12 |
| 6,043,550 A | * 3/2000 | Kuhara et al. | 257/461 |

FOREIGN PATENT DOCUMENTS

| | | |
|---|---|---|
| JP | 2-90576 | 3/1990 |
| JP | 3-69174 | 3/1991 |
| JP | 4-61175 | 2/1992 |
| JP | 8-160259 | 6/1996 |
| JP | 9-139512 | 5/1997 |

* cited by examiner

Primary Examiner—Stephen D. Meier
Assistant Examiner—Monica Lewis
(74) Attorney, Agent, or Firm—Smith, Gambrell & Russell, LLP

(57) ABSTRACT

A submount including a transparent substrate and at least one wavelength selective absorption layer being piled upon the substrate and having a band gap wavelength $\lambda_{g1}$ which is shorter than the necessary light wavelength $\lambda_2$ but longer than the unnecessary light wavelength $\lambda_1$. The submount is inserted between a case (package, metallized pattern) and a bottom incidence PD for insulating the PD from the case and for admitting only the necessary light.

8 Claims, 4 Drawing Sheets

US 6,483,161 B1

SUBMOUNT WITH FILTER LAYERS FOR MOUNTING A BOTTOM-INCIDENCE TYPE PHOTODIODE

BACKGROUND OF THE INVENTION

1. Field of the Invention

This invention relates to a passive optical part for optical communications system which transmits bidirectionally optical signals of two wavelengths between ports simultaneously. Light source devices, for example, light emitting diodes (LEDs) or semiconductor laser diodes (LDs) and photodetectors, for example, photodiodes(PDs) or avalanche photodiodes (APDs) are active optoelectronic parts which are indispensable for building optical communications networks.

2. Description of Related Art

This invention does not propose such an active optoelectronic device but proposes a new passive optical device, that is, a "submount" with a filtering function. The submount is a chip base used for mounting a device chip which requires insulation from a package. The submount is an intermediate passive part between a chip and a package. A main purpose of the submount is to insulating the device from the package. Some devices need no submount (chip base). For example, an independent transistor stored in a metal package has a collector which is directly in contact with the package without a chip base. An independent diode kept in a metallic case is also directly mounted upon the metallic case without submount, since the metallic case is either an anode or a cathode.

Optoelectronic device chips of laser diodes (LDs), photodiodes (PDs) and light emitting diodes (LEDs) are diodes having an anode and a cathode. Unlike the independent metal-case stored diodes or transistors, some reasons forbid the optoelectronic device chips from adhering directly to the package. A package may include a monitoring photodiode (PD), an amplifier IC besides the laser diode (LD) or the photodiode (PD). The coexistence of various device chips prohibit the bottom electrodes (cathode in many cases) of PD chips, LED chips or LD chips from being in direct contact to the metallic package (the ground level). The bottom electrodes of the device chips should be electrically insulated from the package ground level. The "submount" is an insulating board which should be inserted between the chip bottom and the package ground level. Besides the insulation, the submount has other roles of facilitating thermal diffusion, harmonizing the thermal expansion coefficients between the chip and the package or adjusting the height of the chip. In the case of enhancing thermal diffusion, regulating the thermal expansion coefficients or controlling the chip height, the submount need not be an insulator. In the case of the devices stored in metallic packages, the submount is a passive, intermediate chip base which plays the role of keeping a device chip upon a package. The submount has metallized layers formed on both surfaces for the sake of bonding.

Recently planar lightguide circuit (PLC) type transmitting/receiving modules (LD/PD modules) attract attentions instead of the prior discrete type modules which have independent PD, LD, AMP or ICs assembled on print circuit boards. The planar lightguide circuit (PLC) type device contains a silicon bench (Si-platform), device chips, a leadframe and a resin package. The PLC module is made by fixing the device chips upon the silicon bench, fitting the silicon bench on a central part of the leadframe and enclosing the silicon bench and the leadframe with a resin. The leadframe is a thin metal plate having a central part and a number of lead pins.

The PLC type modules never fit device (PD, LD) chips directly upon the leadframe but upon the silicon bench. Sometimes the device chips are directly fitted upon the silicon bench. Other times, rectangle thin plates are inserted between the chips and the silicon bench for adjusting the height of the chips. The rectangle plates for adjusting the height are also called "submount". The submount (chip base) has a wider concept than the insulating base. The submount is a passive optical part which is held between the silicon bench and the chip. Then, the object of the invention is called a "submount" or "optical part" which intervenes between a case and a chip.

The submount or chip base is usually a rectangular intervening plate which is directly fitted upon a case (package, silicon-bench or so) for mounting a chip thereupon. The submount (chip base) is a rectangular opaque insulator having a metallized top surface and a metallized bottom surface. The metallized layers are made by plating, evaporating or printing a metal. Bonding the submount upon a case and die-bonding a chip upon the submount require the metallization on both surfaces.

The submount basic material is opaque and the metallized layers are also opaque. The chip base is triply opaque. There has been no transparent submount. No device chip on the submount has required light entrance via the bottom from the case. High heat conductivity is also one of desired properties of the chip base (submount) for removing heat from the chip rapidly. Ceramics or other dielectric materials are chosen as a material for making submounts. Prevailing submounts are made from alumina ($Al_2O_3$). Alumina excels in rigidity, chemical stability, electrical insulation and inexpensiveness. Alumina is also opaque. There has been no requirement for transparent submounts. There is actually no transparent submount. Prevalent submounts are simple rectangular insulating plates with an m/i/m layered structure, where "m" means a metal and "i" means an insulator.

However, chip bases with an opening are seldom used for mounting a bottom incidence type photodiode upon a silicon bench of a PLC type module.

FIG. 1 shows a proposed PLC type PD portion in an LD/PD module which receives 1.55 $\mu$m wavelength light and transmits 1.3 $\mu$m wavelength light. The PD portion is fabricated upon a flat silicon bench 1. A V-groove 2 is dug from a front end to an intermediate point upon the silicon bench 1 in a longitudinal direction. A PD chip 3 is fitted upon the silicon bench 1 above a rear end of the V-groove 2. The PD chip 3 is a bottom incidence type PD which has a dielectric multilayered filter 5 on the bottom surface and an annular n-electrode 6 enclosing the filter on the bottom. The PD chip has a light receiving part 4 with a p-type region at the top. A frame-shaped rectangular submount 7 is soldered on a metallized pattern on the silicon bench 1. The bottom annular n-electrode 6 of the PD 3 is soldered on the frame-shaped submount 7 having an opening. An optical fiber 8 is fitted in the V-groove 2 with an adhesive. A mirror 9 is formed at the rear end of the V-groove 2. The signal light going out of the optical fiber 8 is reflected by the mirror 9, is turned upward and is introduced into the PD via the dielectric multilayered filter 5. The signal light arrives at the light receiving part 4 and produces photocurrent.

FIG. 1 shows only the PD portion. The LD/PD module contains an LD module (not shown in the figure) besides the device of FIG. 1. The LD module and the PD module are separated by a WDM (wavelength division multiplexer) filter with wavelength selectivity. In addition to the WDM, the PD has the dielectric multilayered filter 5 on the bottom. The transmitting wavelength is 1.3 μm and the receiving wavelength is 1.55 μm. The WDM separates the 1.3 μm sending light and the 1.55 μm receiving light. However, the extinction ratio of the WDM filter is still too poor to forbid a part of the 1.3 μm light from leaking into the PD as stray light. The stray light would induce optical crosstalk in the PD module. The multilayered filter 5 is added to the PD for supplementing the WDM filter. Conventional InP PD has sensitivity to both the 1.55 μm and the 1.3 μm wavelengths. The reason why the conventional InP PD has sensitivity for both 1.55 μm and 1.3 μm.

FIG. 2 shows a section of a conventional InP PD equipped in PD modules. FIG. 2 shows a top incidence type PD having the same layer structure as the bottom incidence type PD. The top incidence type PD differs only on the shape of the electrodes from the bottom incidence type PD.

An n-InP buffer layer 13, an n-InGaAs light receiving layer 14 and an n-InP window layer 15 are epitaxially grown on an n-InP substrate 12 in series. A Zn-diffusion region (p-region) 16 is produced at a center of the top part by diffusing Zn atoms thermally. An annular p-electrode 17 is formed on an outer portion of the Zn-diffusion region 16. The central top aperture enclosed by the annular p-electrode is a opening through which signal light go into the PD. An antireflection film 18 is formed on the central aperture. The antireflection film is produced by piling by turns two kinds of dielectric materials having different refractive index and different thicknesses. The periphery of the chip is coated with a passivation film 19 for protecting revealing ends of the pn-junction. An overall n-electrode 20 is formed on the bottom of the n-InP substrate 12. A reverse bias is applied to the electrodes for detecting light. The reverse bias means an application of a positive voltage to the n-electrode 20 and a negative voltage to the p-electrode 17.

The conventional InP photodiode has a wide sensitivity range since the PD has an InGaAs light receiving layer. FIG. 3 shows a graph showing the sensitivity curve PQR of the InGaAs PD as a function of wavelength. A rise (P) at 0.95 μm corresponds to the band gap wavelength of the InP window layer 15. A fall (R) at 1.67 μm corresponds to the band gap wavelength of the InGaAs light receiving layer 14. An intermediate range Q between P and R denotes nearly uniform sensitivity. The 1.3 μm and 1.55 μm wavelengths are included within the wide range between P(InP band gap) and R(InGaAs band gap). Thus, the conventional InP photodiodes have enough sensitivity to both the 1.31 μm light and 1.55 μm light. The PD senses the 1.3 μm transmitting light which induces the crosstalk.

In the LD/PD module, the dielectric multilayered filter 5 is added to the entrance of the PD for supplementing the insufficient extinction ratio of the WDM filter. The leakage of the transmitting 1.31 μm to the PD is doubly killed by the WDM and the multilayer filter 5.

FIG. 1 shows the PD module having the apertured submount 7 and a 1.31 μm cutting the dielectric multilayered filter 5. The aperture of the submount 7 coincides with the 1.3 μm cutting filter. The submount aims at adjusting the height of the PD chip for increasing light power entering the PD. The submount 7 is dispensable, since the PD requires no insulation from the package.

Drawbacks accompany the prior module containing a couple of the 1.3 μm reflecting filter and the apertured submount. A window should be perforated on the submount made of ceramics. Mechanical drilling on the submount should require an increase of cost of making the PD module. One problem is the additional cost induced by boring the aperture. Another difficulty is caused from problems of the multilayered filter of admitting 1.55 μm (necessary light) but for prohibiting the 1.3 μm (unnecessary light) from passing.

One problem is a strong incident angle dependence of the power of eliminating unnecessary light. The designed extinction ratio can be obtained only by orthogonal incidence (90 degrees) to the multilayered filter. The multilayered filter allows a part of unnecessary light to invade into the filter when the light shoots the filter at a slanting angle (not 90 degrees). Slanting incidence necessary light is partially reflected by the multilayered filter. The slanting incidence decreases the extinction ratio.

Another problem of the dielectric multilayered filter is that the mode of eliminating light is reflection. Since the unnecessary light is not absorbed but reflected, the unnecessary light survives and tries to enter the filter again. The multilayered filter having a number of mutually piled different films of different refractive indexes $n_1$ and $n_2$ has the wavelength selectivity of admitting necessary wavelength and reflecting unnecessary wavelength light.

The complex refractive indexes of the multilayers have no imaginary part but have real parts. The real part of the complex refractive index determines the mode of refraction. The imaginary part of the complex refractive index determines absorption or attenuation. The dielectric multilayers only rely upon the real part of the refractive index of the piled layers.

The dielectric multilayered filter excludes unnecessary light not by absorption but by reflection. The multilayered filter repulses orthogonally incidence unnecessary light by reflection. Once reflected unnecessary light survives in the package. The unnecessary light is repeatedly reflected by the parts in the package. Randomly scattered light in the package is called "stray light". Sometimes unnecessary scattered light penetrates the filter and invades into the PD at slanting angles. The filter cannot repulse slanting unnecessary light. The stray unnecessary light induces serious crosstalk in the PD.

The use of the multilayered filter is still a defective method of eliminating unnecessary light. Crosstalk is a problem induced from imperfection of the WDM filters even in a PD module. The crosstalk induces a more important problem in a LD/PD module which contains an LD and a PD at a short distance in a narrow space. The LD emits strong light signal of $\lambda_1$. The PD should not sense the $\lambda_1$ light which is noise for the PD.

FIG. 4 and FIG. 5 show prior art LD/PD modules. The LD/PD module adopts a WDM filter 21 made of a glass block. Any types of WDM is available for the LD/PD module of FIG. 4. The glass block WDM is made by preparing two isosceles glass columns 22 and 23, evaporating a dielectric multilayered mirror 24 on a slanting wall of one of the isosceles glass columns 22 and 23 and joining two glass blocks on the slanting walls. The dielectric multilayered mirror has a function of allowing 45° incidence transmitting light $\lambda_1$ to pass straight and reflecting 45° incidence receiving light $\lambda_2$ at a 45 degree incidence/reflection angle. An LD 25, a PD 26 and a fiber 27 are placed at three radial positions around the WDM 21. Transmitting light $\lambda_1$ emitted from the LD 25 makes its straight way in the glass WDM 21, passes the mirror 24 without reflection and goes into the fiber 27. On the contrary, the receiving light $\lambda_2$ propagating in the fiber 27 is introduced into the WDM 21. The slanting mirror 24 reflects the $\lambda_2$ light at a 45 degree incidence/ reflection angle. The reflected $\lambda_2$ goes into the PD 26. The ratio of selective reflection or selective admission of necessary light to unnecessary of a WDM light is called an extinction ratio. Current high quality WDMs have a 1:1000 extinction rate at the highest. A small portion of $\lambda_1$ of the LD 25 leaks into the PD via the WDM 21, which causes crosstalk. The LD/PD module separated the path of the PD from the path for the LD. The separation of the paths is favorable for suppressing crosstalk from the LD to the PD.

FIG. 5 shows another LD/PD module which aligns a WDM, a PD and an LD along a straight line. A housing 30 contains a silicon bench (not shown in the figure) having a V-groove. An optical fiber 31 is fitted in the V-groove. The LD 32 is fitted at a rear end of the fiber on the bench. The WDM filter 34 is inserted into an oblique slit cutting slantingly the fiber 31. The PD 33 of a bottom incidence type is mounted above the WDM 34 on the silicon bench.

The LD 32 makes transmitting light of a wavelength $\lambda_1$. The $\lambda_1$ light goes into the fiber 31, passes the WDM filter without reflection and propagates in the fiber 31. The receiving light of a wavelength $\lambda_2$ propagates in the reverse direction in the fiber 31. The $\lambda_2$ is reflected by the WDM 34. The reflected $\lambda_2$ goes upward, enters the PD 33 via the bottom, arrives at the light sensing region 35 and produces photocurrent. The transmitting $\lambda_1$ light and the receiving $\lambda_2$ light simultaneously make their ways in the fiber bidirectionally. Imperfection of the WDM filter 34 allows a part of the $\lambda_1$ light to leak into the PD. Besides the light via the WDM, stray $\lambda_1$ light which is scattered in random directions in the housing 30 shoots the PD at various angles. The leak $\lambda_1$ via WDM and the scattered stray $\lambda_1$ induce serious crosstalk in the PD. The LD/PD module of FIG. 5 sometimes inserts an extra multilayered filter between the WDM 34 and the PD 33.

Simultaneous bidirectional optical communications are annoyed at the crosstalk from the LD to the PD caused by the imperfection of the PD and the random scattering. The above-mentioned multilayered filter 5 is added on the bottom of the PD in the PD module of FIG. 1 for killing the crosstalk. The module of FIG. 5 also adds an extra multi-layered filter between the WDM and the PD for annihilating the crosstalk.

The dielectric multilayered filter has strong incidence angle dependence. The filter has high selectivity for the light shooting at the designed incidence angle with high efficiency. The filter is incompetent for the light with an incidence angle different from the designed angle. In the case of a filter for orthogonal incidence angle, the filter can reflect the orthogonally incidence unnecessary $\lambda_1$. The filter, however, admits a part of unnecessary $\lambda_1$ which shoots the filter with an oblique incidence angle. A. part of the none-orthogonally incidence $\lambda_1$ passes the filter. Stray $\lambda_1$ light having random incidence angles easily penetrates the filter. The strong incidence angle dependence deprives the multi-layered filter of the power of eliminating all the unnecessary $\lambda_1$. The incidence angle dependence is one of the most serious defects of the dielectric multilayered filters.

Another drawback of the dielectric multilayered filters is that the filter repulses unnecessary light by reflection. Reflected light survives in the package and is reflected in the package. Multiple reflection makes stray light in the package. The stray light disturbs the filtering function of the multilayered filter. The alternative of the dielectric multi-layered filter is reflection or passage. The reflection is imperfect for the meaning of annihilating unnecessary light.

In the design of the dielectric multilayered filter, the refractive indexes have only real parts. The imaginary parts of the refractive indexes are deemed to be constant against a change of wavelengths. The imaginary parts of the refractive index mean absorption. However the imaginary part of the refractive index of dielectrics has, in general, poor wavelength dependence. The change of the imaginary parts by a wavelength variation is nearly zero.

One purpose of the present invention is to provide a submount intervening between a package and a PD and having a function of eliminating unnecessary light.

Another purpose of the present invention is to provide a submount intervening between a package and a PD and having a function of preventing leak LD light or stray LD light from going into the PD of an LD/PD module.

A further purpose of the present invention is to provide a submount intervening between a package and a PD and having a function of eliminating unnecessary light with arbitrary incidence angles unlike the dielectric multilayered filter.

A further purpose of the present invention is to provide a submount having high heat resistance.

A further purpose of the present invention is to provide a submount suitable for facilitating mounting of a PD.

SUMMARY OF THE INVENTION

The optical part (submount) of the present invention is a passive chip base inserted between a metal case and a chip which includes a semiconductor or insulator substrate which is transparent to necessary light and at least one epitaxially-grown wavelength selective absorption films formed on at least one surface of the substrate which absorbs unnecessary light.

The wavelength of the unnecessary light is denoted by $\lambda_1$ and the wavelength of the necessary light is denoted by $\lambda_2$. The submount of the present invention is made by forming epitaxially wavelength selective absorption films which absorb the $\lambda_1$ light upon a transparent substrate which allows the $\lambda_2$ light to pass.

All the conventional submounts are opaque. In contradiction to the prior submounts, he substrate of the submount of the present invention is transparent. The wavelength elective absorption layer is transparent to the necessary $\lambda_2$ but opaque to the unnecessary $\lambda_1$. The chip base of the present invention allows only $\lambda_2$ to pass through but annihilates $\lambda_1$. The epitaxially-grown wavelength selective absorption films give the present invention such an asymmetric character of cutting $\lambda_1$ and admitting $\lambda_2$. $\lambda_1$-opacity and $\lambda_2$-transparency is a conspicuous feature of the present invention.

The submount of the present invention has common elements as a chip base which is inserted between a package (metal pattern) and a PD chip for insulating the PD from the package (metal pattern). The submount has fringing metal-lized layers on both surfaces for bonding the submount with a package and a PD chip by soldering. The central part of the submount should be free from the metallized layers for allowing $\lambda_2$ to penetrate. Thus, the metallized layers should coat only the fringe of the submount. When a resin adhesive is applied to one of the PD/submount bonding or the submount/case bonding, the metallized layer can be omitted for the surface for the resin adhesion. The central part without the metallized layer is blank or coated with an antireflection film.

The transparent substrate can be made from semiconductors, glass (amorphous materials), ceramics or dielectrics which are transparent to the object light $\lambda_2$. Semiconductors are the most suitable materials.

The wavelength selective absorption film can be also made from semiconductors, dielectrics, amorphous materials which have the required wavelength selectivity for absorbing $\lambda_1$ but admitting $\lambda_2$. Semiconductors are the most suitable to the wavelength selective absorption film. An appropriate pair is a semiconductor transparent substrate and semiconductor wavenumber selective absorption films.

The band gap of the wavelength selective absorption film should be determined by the wavelengths $\lambda_1$ and $\lambda_2$. The concept of the band gap can be defined to semiconductor, dielectrics and amorphous materials. In the case of semiconductors or dielectrics, both a polycrystal and a single crystal are available, because they have the same band gap. The absorption edge wavelength $\lambda_g$ which corresponds to the band gap Eg by the relation of $\lambda_g$=hc/Eg, where h is Planck constant and c is light velocity in vacuum. The wavelength selective absorption material should be chosen by the condition of $\lambda_1 < \lambda_g < \lambda_2$.

Light filtering function of the present invention is quite different from prevalent dielectric multilayer filters which pile two or three kinds dielectric films by turns but a bit akin to photodiodes. The present invention owes the wavelength selectivity to the band gap of the material. Since the submount is a passive part, the submount should dispense with the reverse bias which would produce a wide depletion layer at the pn-junction, would generate pairs of electron and hole, would attract holes to the p-region and electrons to the n-region and would make photocurrent in a photodiode. The submount of the present invention has no pn-junction, no reverse bias, no depletion layer and no photocurrent.

The submount lacks the reverse bias. The reverse bias on the pn-junction in a PD aims at making photocurrent. The photoelectric conversion of absorbing light and generating photocarriers (electrons and holes) occurs also in the submount without pn-junction and reverse bias so long as the light energy is larger than the bang gap. The photoelectric conversion is independent of the pn-junction and the reverse bias. The probability of the photoelectric conversion is free from the reverse bias.

The light having wavelength $\lambda_1$ shorter than $\lambda_g$ is absorbed and is converted into pairs of holes and electrons in the wavelength selective absorption layer. Since no bias is applied to the wavelength selective absorption layer, thermal diffusion and thermal agitation are origins of motion. No concentration distribution appears in the layer. The thermal agitation is the origin of motion of the holes and electrons. The averages of velocities and displacement are zero for the thermal agitation. The holes and the electrons stay in the wavelength selective absorption layer. The holes soon collide with electrons, recombine with the electrons, make heat and vanish. A series of the above facts can be simply expressed by that the $\lambda_1$ light is absorbed in the wavelength s elective absorption layer. Since $\lambda_g$ is shorter than $\lambda_2$, the wavelength selective absorption layer absorbs no $\lambda_2$ light. Thus, the wavelength selective absorption layer absorbs $\lambda_1$ but admits $\lambda_2$.

The next problem is how to determine the minimum thickness of the wavelength selective absorption layer. Absorption coefficient $\alpha$ is defined in an absorption material. $\exp(-\alpha)$ is an attenuation rate for a unit length propagation. $\alpha$ is zero for the light of a longer wavelength than the absorption edge wavelength $\lambda_g$. $\alpha$ is a positive definite for the light of a shorter wavelength than $\lambda_g$. When the light makes its way by a distance x, the light of a unit power is attenuated to $\exp(-\alpha x)$. The wavelength selective absorption layer of a thickness d can decrease unnecessary light ($\lambda_1$) to a ratio of $\exp(-\alpha d)$. When the required attenuation is determined to be 1/100 or 1/1000, the suitable thickness d of the wavelength selective absorption layer can be calculated.

For example, the InGaAsP of $\lambda_g$=1.42 $\mu$m has $\alpha=10^4$ cm$^{-1}$ for 1.3 $\mu$m. If the wavelength selective absorption layer is made by the InGaAsP of $\lambda_g$=1.42 $\mu$m, a thickness of d=5 $\mu$m gives an attenuation ratio less than 1/100.

The advantages of the present invention are described. Conventional submounts consist of a ceramic substrate, in particular, alumina ($Al_2O_3$) substrate and overall metallized layers coating both surfaces of the substrate. Both the ceramic and the metallized layers are opaque. Prior submounts are opaque. The present invention replaces the ceramic substrate by a transparent semiconductor/insulator substrate and replaces the overall metallized layer by fringing metallized layers. The present invention adds a wavelength selective absorption layer upon the transparent substrate. The wavelength selective absorption layer admits necessary light $\lambda_2$ but absorbs unnecessary light $\lambda_1$. The submount of the present invention allows necessary light $\lambda_2$ to pass but absorbs unnecessary light $\lambda_1$.

A WDM filter separates the receiving light from the transmitting light in an LD/PD module. The submount of the present invention lowers the crosstalk from the LD to the PD by complementing the separating function of the WDM. Although the submount is only a passive element, the effect is conspicuous.

However, someone may feel hesitant of making use of expensive semiconductor element for a submount (chip base). An increase of semiconductor wafer size decreases the cost per chip. The cost of substrate is not so high. The cost of epitaxially growing the wavelength selective absorption layer is also decreased by the matured wafer process. The semiconductor submounts of the present invention can be made in a manner in an apparatus similar to making LDs or PDs. The probability of diverting the semiconductor technology lowers the cost of fabrication of the submounts.

On the contrary, the dielectric multilayered filter is rather expensive, since the multilayer requires a number of repetitions of coating of different dielectric layers on a resin substrate. The complexity of the layer structure raises the cost.

The dielectric multilayered filter made upon a resin substrate has poor resistance against heat. The resin filter should be inserted into the module for avoiding heat attack after mounting the PD, the LD and other devices on the package. The submount of the present invention with high heat resistance facilitates the assembly of LD/PD modules.

DETAILED DESCRIPTION OF THE PREFERRED EMBODIMENTS

Figure 1:
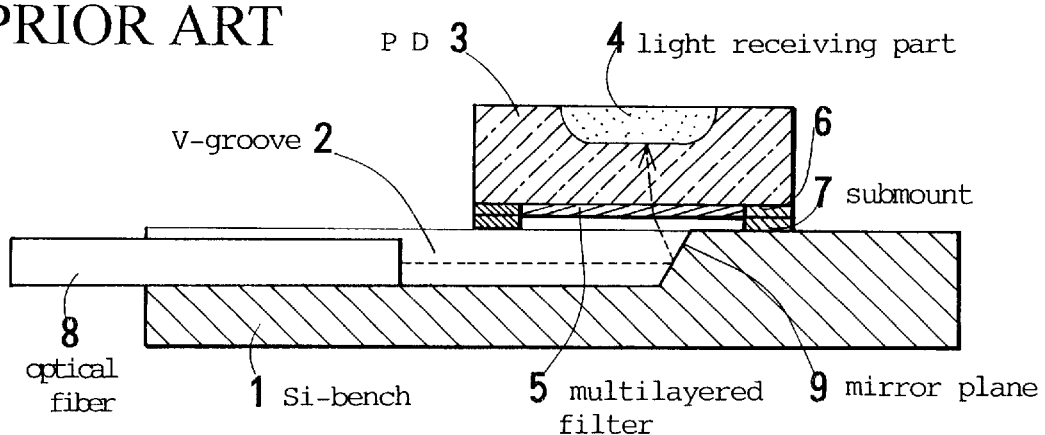
FIG. 1 is a sectional view of a prior art PD module which assembles a silicon bench having a V-groove with a bottom incidence type PD.

The optical part (submount) of the present invention includes a transparent substrate and at least one wavelength selective absorption layer coating at least one surface of the ail transparent substrate. The substrate is transparent both for necessary light and unnecessary light. The wavelength selective absorption layer admits necessary light but prohibits unnecessary light from passing. Not only prohibiting the unnecessary light from penetrating, the wavelength selective absorption layer absorbs the unnecessary light. The absorption annihilates the unnecessary light at the point in the wavelength selective absorption layer. The wavelength selective absorption layer can absorb and extinguish all the unnecessary light irrespective of the incidence angle. The submount is superior in the annihilation and the incidence angle independence to the dielectric multilayered filter.

A dielectric multilayered filter is designed for reflecting all the unnecessary light going into the filter at a predetermined incidence angle (in a vertical direction in many cases). The dielectric filter cannot exclude stray light which has random incidence angles. Some stray light directly enters the dielectric multilayered filter. Since the unnecessary light is only reflected on the dielectric filter, some part of the unnecessary light is reflected and is returned back to the PD. The dielectric multilayered filter has the inherent drawbacks of the reflection and the strict incidence angle dependence. The dielectric filter is entirely impotent against stray light.

The present invention is far superior to the dielectric multilayered filter. Furthermore this invention makes use of the optical part not as a filter but as a submount (chip base).

The principle of the present invention is now explained. A semiconductor or an insulator has a conduction band, a valence band, a band gap (or forbidden band) between the conduction band and the valence band and a Fermi level staying in the band gap (forbidden band). The material having the Fermi level in the conduction band becomes a metal having conduction electrons. The material having the Fermi level in the forbidden band (band gap) becomes an insulator or a semiconductor having few carriers. The difference between the semiconductor and the insulator is not decisive but depends upon the band gap and the dopant concentration. Here, semiconductor and insulator should not be discriminated as a material of the wavelength selective absorption layer. If the semiconductor/insulator has no impurity level in the band gap, the semiconductor/insulator cannot absorb the light having lower energy than the band gap Eg. The light having the lower energy passes the material.

The band gap energy is denoted by Eg. The corresponding wavelength $\lambda_g$ of light is denoted by $\lambda_g$=hc/Eg (h is the Planck constant and c is the light speed in vacuum). The wavelength $\lambda_g$ is called a "band gap wavelength" or an "absorption edge wavelength". The absorption edge wavelength $\lambda_g$ is a physical parameter which characterizes the semiconductor/insulator. Absorption of light by a semiconductor/insulator signifies an electron excitation from the valence band over the band gap to the conduction band. Thus, the semiconductor/insulator can absorb only the light having energy larger than the band gap. Namely, the light of a shorter wavelength $\lambda<\lambda_g$ is absorbed. But the light of a longer wavelength $\lambda<\lambda_g$ not absorbed. The longer wavelength $\lambda<\lambda_g$ is allowed to pass through.

The unnecessary light is denoted by $\lambda_1$. The necessary light is denoted by $\lambda_2$. Both wavelengths satisfy an inequality of $\lambda_1<\lambda_2$. For the PD in the bidirectional optical communications system, the sending light corresponds to the unnecessary light $\lambda_1$ and the receiving light corresponds to the necessary light $\lambda_2$.

The band gap wavelength of the transparent substrate is denoted by $\lambda_{g2}$. The substrate should be transparent both to $\lambda_1$ and $\lambda_2$. $\lambda_{g2}$ should be shorter than $\lambda_1$ and $\lambda_2$.

The band gap wavelength of the wavelength selective absorption layer is denoted by $\lambda_{g1}$. The wavelength selective absorption layer should be transparent to $\lambda_2$ but opaque to $\lambda_1$. $\lambda_{g1}$ should be shorter than $\lambda_2$ but longer than $\lambda_1$. Two inequalities are given to the band gaps of the wavelength selective absorption layer and the substrate.

wavelength selective absorption layer; $\lambda_1<\lambda_{g1}<\lambda_2$.  (1)

substrate; $\lambda_{g2}<\lambda_1, \lambda_2$.  (2)

Inequality (1) is a requisite. But inequality (2) is optional. The condition for the substrate can be alleviated to, substrate; $\lambda_1<\lambda_{g2}<\lambda_2$.  (3)

Inequality (3) includes inequality (2) for determining the suitable range of $\lambda_{g2}$. Namely, this invention can be defined in a wider range by, wavelength selective absorption layer; $\lambda_1<\lambda_{g1}<\lambda_2$.  (1)

substrate; $\lambda_{g2}<\lambda_2$.  (4)

The substrate should allow the necessary light $\lambda_2$ to pass. The substrate may either absorb or admit the unnecessary light $\lambda_1$. Since inequality (4) does not restrict the lowest limit of $\lambda_{g2}$, the substrate can be either a semiconductor or an insulator with a wide band gap. The wavelength selective absorption layer should be a semiconductor determined by inequality (1) $\lambda_1<\lambda_{g1}<\lambda_2$.

Theoretically, a wider set of inequalities (1)+(4) is the condition of determining the substrate and the wavelength selective absorption layer. But practically a narrower set of inequalities (1)+(2) is more important than the set of (1)+(4). The reason is described hereafter.

The wavelength selective absorption layer which is epitaxially made as a thin film can be a mixture crystal of arbitrary ratios. $\lambda_{g1}$ of the wavelength selective absorption layer (epi-layer) can finely be adjustable by controlling the mixture ratios of the mixture crystal.

However, the materials of the substrate are restricted within a narrow range. The substrate should be made from inexpensive materials which can be made by sufficiently matured crystal growth technology, for example, Czochralski method or Bridgman method. The semiconductor single crystal wafers which are on the market are silicon (Si), gallium arsenide (GaAs), indium phosphide (InP) and gallium phosphide (GaP). Practically, there is a narrow room of choosing $\lambda_{g2}$. Examples of suitable sets of the epitaxial layer and the substrate are listed now as (epi-layer)/(substrate), 1. InGaAsP/InP
2. GaInNAs/GaAs
3. GaAsSb/InP
4. AlGaAsSb/InAs
5. TlInGaP/InP
6. TlInGaP/GaAs
7. TlInGaAs/InP
8. Si/Ge (direct joining)
9. Ge/GaAs (direct joining)
10. Ge/InP (direct joining)
11. GaInAsBi/InP
12. BGaInAs/GaAs All the above sets can be applied to the pair of 1.3 µm unnecessary light ($\lambda_1$) and 1.55 µm necessary light ($\lambda_2$). $\lambda_{g1}$ of the wavelength selective absorption layer (epi-layer) is designed to be 1.4 µm. Then, $\lambda_1 < \lambda_{g1} < \lambda_2$.

In the sets of 8 to 10, silicon has a bang gap wavelength of 1.1 µm. GaAs has a band gap wavelength of 0.87 µm. InP has a band gap wavelength of 0.92 µm. Ge has a band gap wavelength of 1.55 µm. Direct joining of Si, GaAs and InP can produce a substantial band gap wavelength of about 1.4 µm. The above examples aim at the set of the 1.3 µm unnecessary light and the 1.55 µm necessary light. This invention can be also applied to another set of unnecessary light and necessary light. In another case, $\lambda_{g1}$ will not be 1.4 µm.

The present invention proposes a novel optical part (submount) having a transparent substrate (e.g., InP substrate) and wavelength selective absorption layers (e.g., InGaAsP epitaxial layers) piled on the substrate for absorbing unnecessary light (e.g., 1.3 µm ) and admitting necessary light irrespective of the incidence angle. The filtering submount is based on a novel idea of exploiting absorption of a semiconductor single film for excluding unnecessary light instead of dielectric multilayer filter which reflects unnecessary light. The conventional dielectric multilayer filter is suffering from the drawback of the incidence angle dependence of the function of reflecting unnecessary light. The incidence angle dependence is completely denied by the submount which annihilates unnecessary light by absorption instead of reflection.

An embodiment suitable for a bidirectional LD/PD module making use of the 1.3 µm ($\lambda_1$) band for transmission signals and the 1.55 µm ($\lambda_2$) band for receiving signals. The unnecessary light for the PD is 1.3 µm. The necessary light for the PD is 1.55 µm. The intermediate wavelength $\lambda_g$ is about 1.4 µm for the submount. The most suitable material for the wavelength selective absorption layer is an epitaxially-grown quadruple component mixture InGaAsP film.

Figure 6:
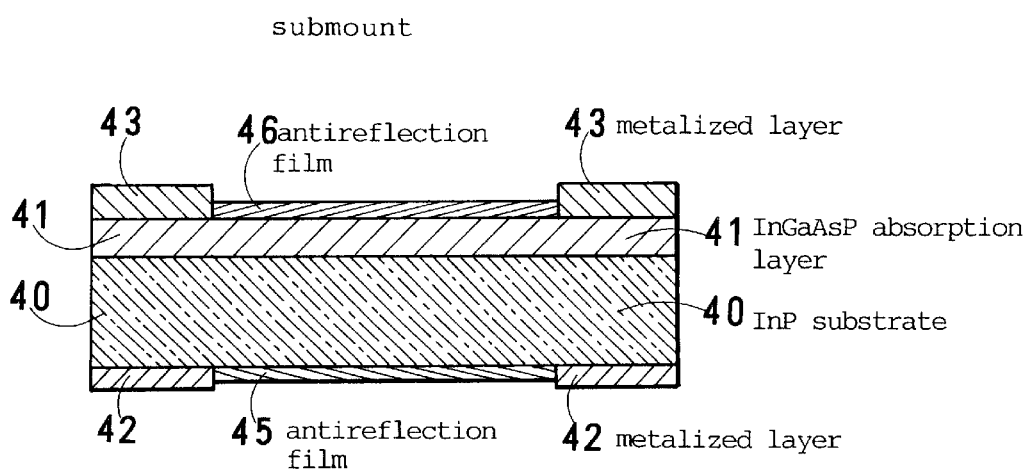
FIG. 6 is a sectional view of an embodiment of a submount of the present invention.

FIG. 6 is a sectional view of the embodiment submount. The submount has a semi-insulating (SI—) InP substrate 40 and an InGaAsP wavelength selective absorption layer 41 grown epitaxially upon the InP substrate 40 by the chloride method. The material of the substrate can be non-doped InP, S-doped InP, Sn-doped InP, Cr-doped InP or Fe-doped SI InP. The S-doped InP and the Sn-doped InP give conductive substrates which are suitable for making conductive submounts. The non-doped InP, the Fe-doped InP and the Cr-doped Inp give semi-insulating substrates which are suitable for making insulating submounts. The Fe-doped SI(semiinsulating) InP excels in transparency. In the case of making insulating submounts, the Fe-doped SI InP is the best material. A fringing metallized layer 42 is formed at the periphery of the bottom of the InP substrate 40. Another fringing metallized layer 43 is formed at the periphery of the top of the InGaAsP wavelength selective absorption layer 41. The bottom metallized layer 42 is required for die-bonding the submount upon a package (case or wiring pattern) by soldering. The top metallized layer 43 is required for soldering a PD chip upon the submount. The fringing metallized layers 42 and 43 enable the submount to allow necessary light to pass through central portions. The central portion of the bottom of the InP substrate 40 is coated with an antireflection film 45 which is a dialectic multilayered filter for prohibiting necessary light from being reflected. The central portion of the top of the InGaAsP wavelength selective absorption layer 41 is coated with another antireflection film 46. The antireflection films 45 and 46 are dispensable.

Figure 3:
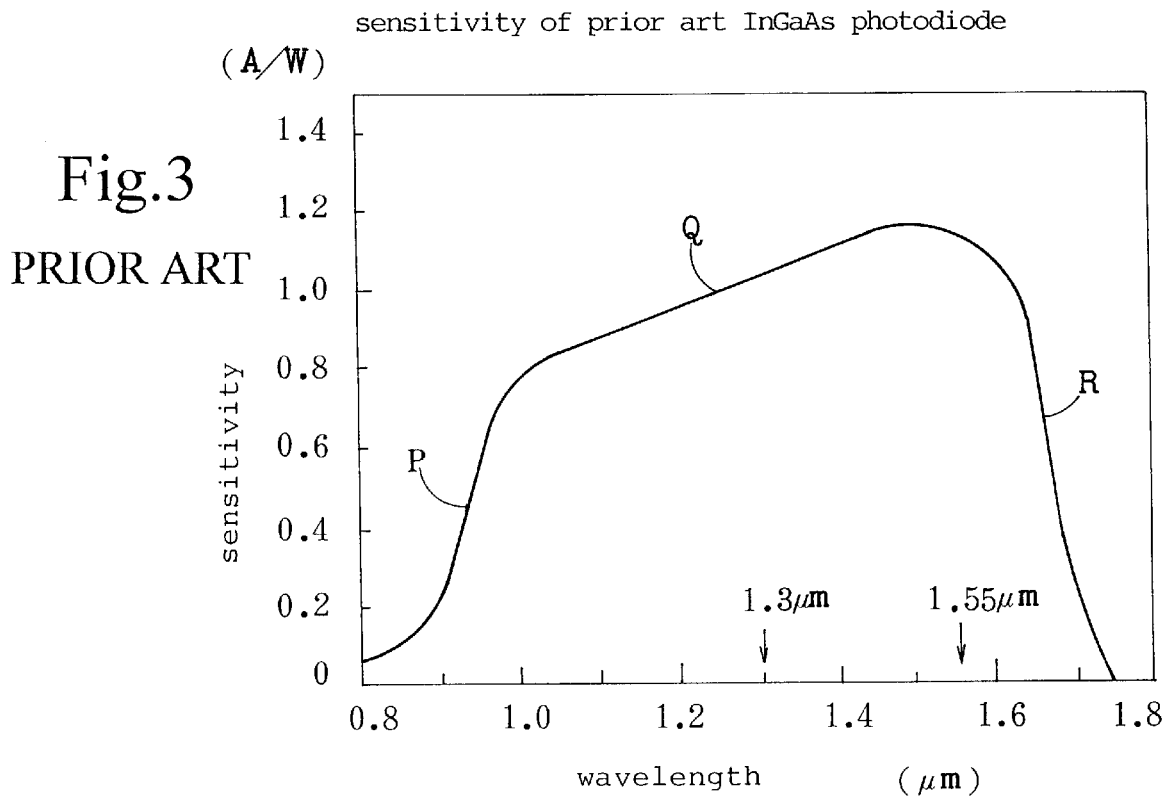
FIG. 3 is a graph of the sensitivity of a prior art PD having an InGaAs light receiving layer as a function of wavelength.
Figure 4:
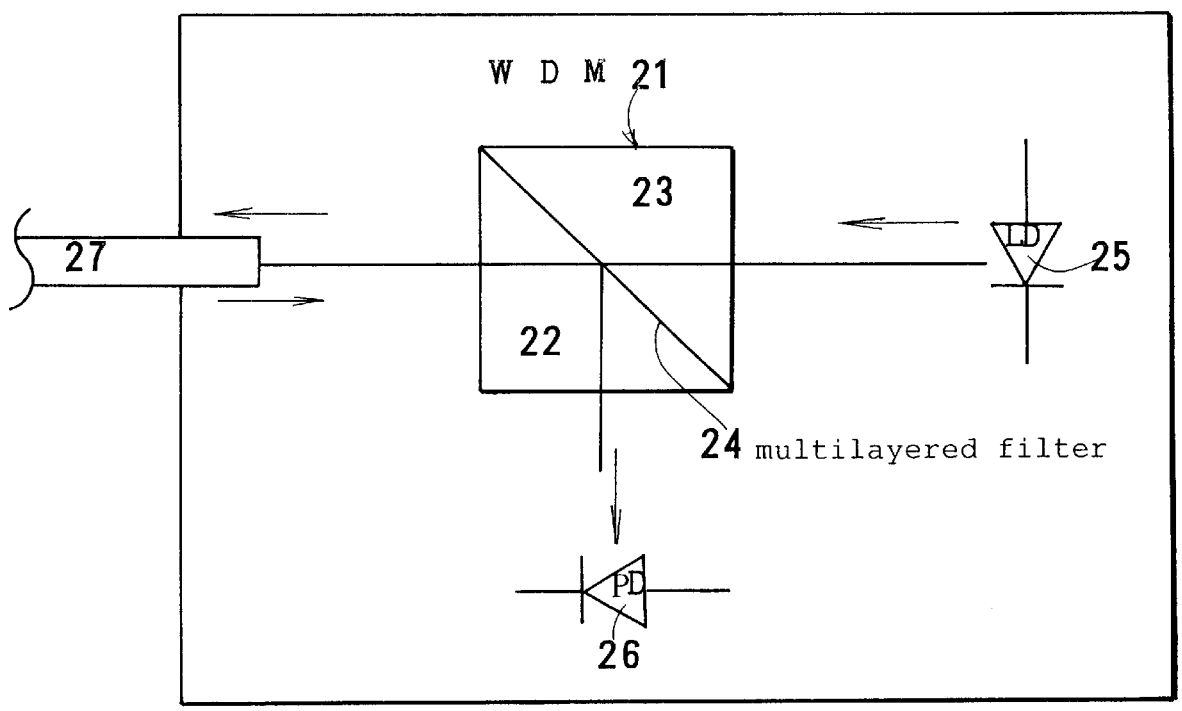
FIG. 4 is a schematic view of a prior LD/PD module storing a WDM, an LD and a PD in different directions in a case and separating the PD receiving light from the LD transmitting light by a WDM filter.

The InP substrate 40 is a rectangle of a 200 µm thickness. The InGaAsP wavelength selective absorption layer 41 has a thickness of 5 µm. The absorption edge wavelength $\lambda_{g2}$ of the InP substrate 40 corresponds to the rise (P; about 0.9 µm) of the sensitivity curve of FIG. 3. The InP substrate is transparent to both the 1.3 µm light and the 1.55 µm light. The InGaAsP layer 41 has the function of the wavelength selective absorption.

The quadruple component mixture crystal InGaAsP has two mixture parameters. One parameter is consumed for satisfying the lattice fitting condition with the InP substrate. An extra freedom of defining the components enables the mixture crystal to determine an arbitrary absorption edge wavelength $\lambda_{g1}$. Here, the absorption edge wavelength of the InGaAsP layer is determined to be $\lambda_{g1}$=1.42 µm.

Figure 7:
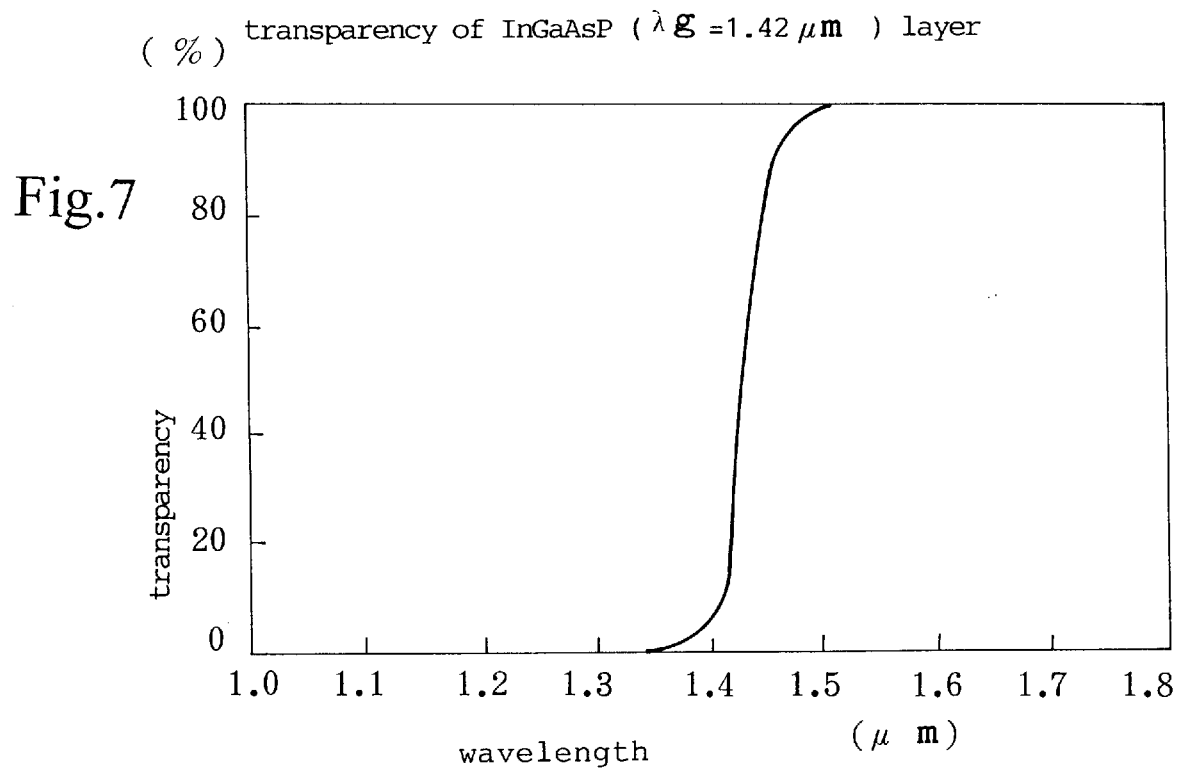
FIG. 7 is a graph of transparency of the InGaAsP ($\lambda_g$=1.42 μm) which is the material of the wavelength selective absorption layer of the embodiment as a function of wavelength.

FIG. 7 shows the wavelength-dependence of the transparency of the filtering submount. The abscissa is a wavelength (µm). The ordinate is a transparency (%). The transparency of the filtering submount is zero for wavelengths shorter than 1.36 µm. All the light of the wavelength shorter than 1.36 µm is absorbed by the filtering submount. The curve begins rising near 1.41 µm. The transparency attains at 50% at 1.42 µm (=$\lambda_{g1}$) and 80% at 1.45 µm. The transparency reaches 100% at 1.52 µm. The wavelength longer than 1.52 µm maintains the 100% transparency. The transparency ratio of 1.55 µm to 1.3 µm is more than 100:1. Namely, the submount gives an extinction ratio smaller than 1/100. The measured result coincides with the calculation based upon a 5 µm thickness (d) and a $1 \times 10^4$ cm$^{-1}$ absorption coefficient ($\alpha$) of the InGaAsP ($\lambda_{g1}$=1.42 µm).

Figure 8:
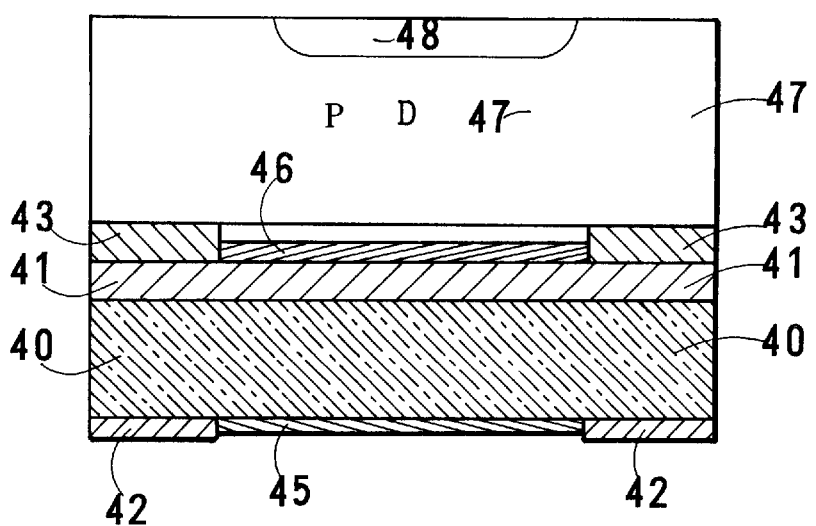
FIG. 8 is a sectional view of a bottom incidence type PD riding upon the submount of the embodiment.

A bottom incidence type PD is mounted upon the filtering submount as shown in FIG. 8 for measuring the sensitivity of the PD for the 1.3 µm light and 1.55 µm light. The lower half with hatched sections signifies the filtering submount of the present invention. The submount has the InP substrate 40, the InGaAsP selective absorption layer 41 epitaxially grown upon the substrate, the fringing metallize 42 on the bottom of the substrate 40, the fringing metallize 43 on the top of the InGaAsP selective absorption layer 41 and antireflection films 45 and 46 on the bottom and the top.

Figure 2:
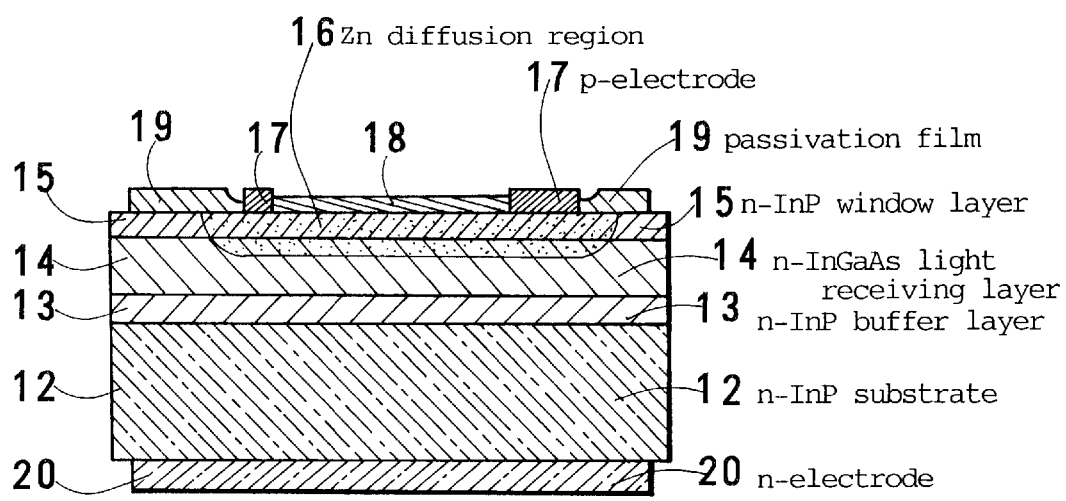
FIG. 2 is a sectional view of a prior art top incidence type PD having an InGaAs light receiving layer.
Figure 5:
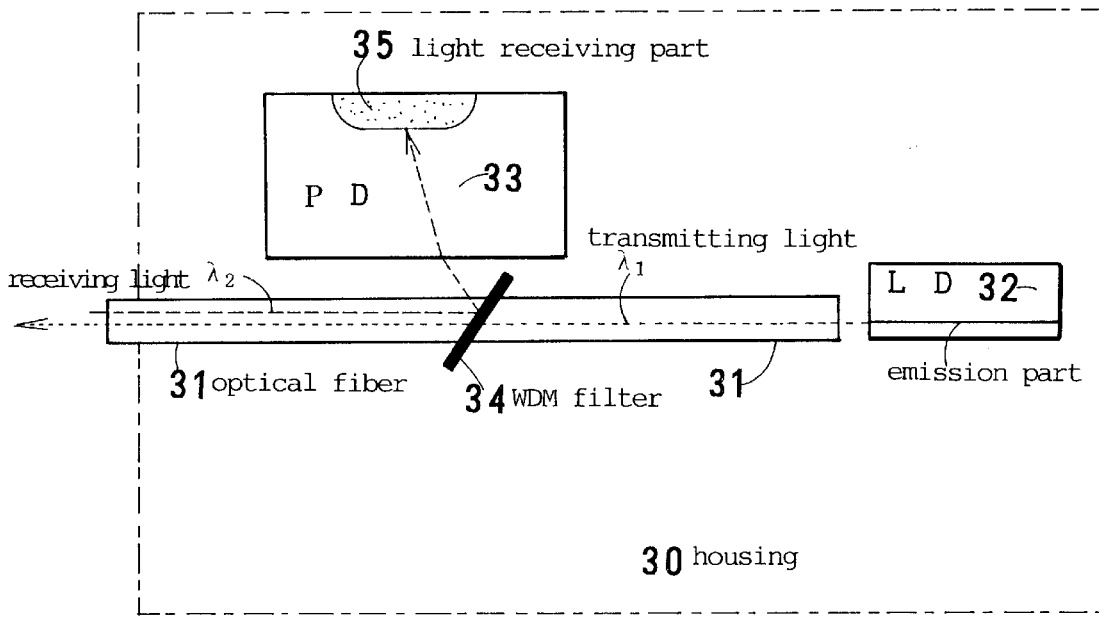
FIG. 5 is a schematic view of a prior LD/PD module mounting a WDM, an LD and a PD along a straight line on a silicon bench and separating the PD receiving light from the LD transmitting light by a WDM filter.

The upper half with blank sections signifies the bottom incidence type PD 47 having a central light receiving part 48 as shown in FIG. 1 and FIG. 5. The PD 47 has the same layered structure as the PD shown in FIG. 2. The layered structure is made by epitaxially growing an n-InP buffer layer 13, an n-InGaAs light receiving layer, and an n-InP window layer 15 by turns on an n-InP substrate 12. The top central p-region is made by thermally diffusing zinc atoms at the central part of the InP window layer. The p-electrode is an overall electrode covering the p-region. Substituting the apertured submount 7, the submount of the present invention will be fitted with the PD upon a silicon bench 1 as shown in FIG. 1. Otherwise, the submount of the present invention can be inserted between the PD and the silicon bench (not shown) in the LD/PD module shown in FIG. 5. The submount can be applied to supporting a bottom incidence type PD in a PD module of FIG. 1 or an LD/PD module of FIG. 5. The measured extinction ratio of 1.3 μm to 1.55 μm of the PD on the submount is also smaller than 1/100 which corresponds to the sensitivity ratio 1:100 of the filtering submount.

We claim:

1. A submount with filter layers for mounting a bottom-incidence type photodiode chip upon a package by intervening between the package and the bottom-incidence type photodiode chip, comprising:
   a transparent substrate having a flat top surface and a flat bottom surface; and
   at least one wavelength selective absorption layer being piled upon at least one surface of the substrate and having a band gap wavelength $\lambda_{g1}$ which is shorter than necessary light wavelength $\lambda_2$ but is longer than unnecessary light wavelength $\lambda_1$, wherein
   the wavelength selective absorption layer excludes a pn-junction,
   the wavelength selective absorption layer has a same size as the substrate, and
   a fringing metallized layer is formed on a periphery of at least one of the surfaces.

2. The submount according to claim 1, wherein fringing metallized layers are formed on both the surfaces.

3. The submount according to claim 2, wherein the transparent substrate is made from one of amorphous materials, ceramics, dielectric materials and semiconductors.

4. The submount according to claim 3, wherein the wavelength selective absorption layer is made from a semiconductor or an insulator having a band gap wavelength $\lambda_{g1}$ which satisfies an inequality $\lambda_1 < \lambda_{g1} < \lambda_2$.

5. The submount according to claim 4, wherein the transparent substrate is a semiconductor single crystal and the wavelength selective absorption layer is a semiconductor mixture crystal film epitaxially grown upon the semiconductor single crystal substrate.

6. The submount according to claim 5, wherein the transparent substrate is an InP single crystal and the wavelength selective absorption layer is an InGaAsP single crystal film epitaxially grown upon the InP single crystal substrate.

7. The submount according to claim 6 wherein the transparent InP substrate is a Fe-doped SI(semi-insulating)-InP single crystal.

8. The submount according to claim 6, wherein the band gap wavelength $\lambda_{g1}$ of the InGaAsP wavelength selective absorption layer is about 1.4 μm.

* * * * *